June 23, 1970 C. W. SMITH 3,516,155

METHOD AND APPARATUS FOR ASSEMBLING ELECTRICAL COMPONENTS

Original Filed Nov. 23, 1964 2 Sheets-Sheet 1

INVENTOR.
CHARLES W. SMITH
BY
Roger A. Marrs

METHOD AND APPARATUS FOR ASSEMBLING ELECTRICAL COMPONENTS

Original Filed Nov. 23, 1964

INVENTOR.
CHARLES W. SMITH

BY

Roger A. Marrs

United States Patent Office 3,516,155
Patented June 23, 1970

3,516,155

METHOD AND APPARATUS FOR ASSEMBLING ELECTRICAL COMPONENTS

Charles W. Smith, Canoga Park, Calif., assignor to The Bunker-Ramo Corporation, Canoga Park, Calif., a corporation of Delaware Continuation of application Ser. No. 413,024, Nov. 23, 1964, now Patent No. 3,355,078, dated Nov. 28, 1967. This application Feb. 2, 1967, Ser. No. 613,551
Int. Cl. H05k 3/30
U.S. Cl. 29—626 5 Claims

ABSTRACT OF THE DISCLOSURE

A template having depressions holds electrical components so that the lead ends register with and contact with selected conductor pads on a substrate. By employing a solder paste, which is applied to the selected pads on the substrate via a pattern of apertures in a plate, and then placing the component laden template against the substrate, the lead ends will rest against mounds of solder. By crimping the lead ends into flat pads, and by causing the pads to angularly project into the solder mounds, the component is forced into its depression so that the template forms a heat sink for the dissipation of heat developed during the solder connection of the lead ends to the conductive pads on the substrate. Surface tension of the molten solder mounds will cause the component to right itself with the template depression in the event the lead ends are not in proper registry with the conductive pads.

This application is a continuation of my copending patent application entitled "Apparatus for Assembling Electrical Components," filed on Nov. 23, 1964, and bearing Ser. No. 413,024 now Pat. No. 3,355,078.

This invention relates to apparatus for assembling electrical components and, more particularly, to a novel apparatus useful in assembling discrete electrical components on printed circuit boards employing a template for accurately holding a plurality of such components in position while they are being mechanically and electrically connected into a circuit carried on the board and for readjusting the physical position of such components in the event proper lead registration is inadvertently misaligned with respect to attachment pads carried on the circuit board.

In the electronic industry, it has been the present trend to provide smaller and smaller electronic circuits and electrical components. This trend has now reached the point where a thin-film circuit carried by a printed circuit board two inches square or less may require the connection thereto of several dozen discrete components. Thus far, such connections have had to be laboriously made by hand in an exceedingly time-consuming delicate operation. In addition, because of the exceedingly small size of the components and the conductors to which the leads of the components are to be attached, many errors have resulted that have led in some cases to destruction of the circuitry or, at best, to expensive re-work. Thus, the cost of such circuitry is quite high.

One attempt to provide means for holding the discrete components while connection is being made between the ends of the leads of the components and the conductive circuits carried on the circuit board, which partially obviates the aforementioned problems and difficulties, resides in the apparatus disclosed in my copending application noted above. Although a novel template is disclosed in that patent application for holding discrete components in position so that the lead ends will register with conductive pads on circuit boards, additional problems have arisen which reside in the fact that the components are not always sufficiently held in the formed recesses of the template, so that often the components are not in proper alignment with the conductive lands or pads carried on the circuit board so that proper securement cannot be made between the lead ends and the conductive pads. Such improper connection effects a weak mechanical and electrical connection, with the result that the components may easily break away from their securement on the circuit board under environmental conditions such as vibration, circuit overload, mishandling, etc.

However, the apparatus of the present invention provides a template which holds the components properly positioned with the component leads in registry and in contact with the circuit conductor pads so that soldered connection can be had between the ends of the leads and the conductor pads. Registration between the lead ends and the conductor pads is achieved by employing a fixture for applying a bonding agent to selected locations on the board which, when molten, presents a surface tension adapted to draw the lead ends into a vertical position to assure proper registration of the component lead ends with the selected conductive pads. The advantage of the present invention resides in providing means for properly placing an adhesive or bonding agent, such as solder paste, on selected conductive pads or strips and subsequently employing a template means for holding the components in position so that the lead ends of the components will register with the adhesive or bonding agent. By employing this technique, misalignment and registration encountered with prior art devices are obviated and means are provided for automatically aligning the lead ends with the conductive pads when the adhesive or bonding agent is molten. Therefore, the apparatus and method of the present invention provide simplicity in fabricating techniques, assurance of proper mechanical and electrical connection between the lead ends and the conductive pads, and result in an electronic package module that may be produced in mass production and have a high rate of yieldability.

In one embodiment of the present invention, the apparatus employs a jig or fixture for retaining the printed circuit board in a position so that its surface carrying the conductive pads is completely exposed. Next, a plate having a pattern of apertures or holes formed therein is placed over the top of the printed circuit board so that particular holes in the plate will register with selective conductor pads. A suitable adhesive or bonding agent, such as a solder paste, is placed on top of the apertured plate and wiped over the plate so that when excessive paste is scraped off, a portion of the paste remains within the apertures of the plate in communication with the selected conductive pads. Next, the apertured plate is removed so that a plurality of solder paste mounds are left remaining on the selected conductive pads on the circuit board.

A template is employed having depressions and channels formed therein to hold and properly position the components which are retained in the depressions such as by developing a vacuum therein or by means of gravity.

By placing the component-laden template against the circuit board, the lead ends will rest against the adhesive or bonding agent placed on the conductive pads. It has been found that by slightly deforming the lead ends of the components into flat pads, and by crimping the lead ends to angularly project into the adhesive or bonding agent, the comopents are forced into the recesses within the template to form a heat sink for dissipating the head developed during the bonding connection procedure. Surface tension of the molten adhesive or bonding agent will cause the components to right themselves within the template recesses in the event the lead ends are not in proper registry with the conductive pads. Alternatively, this latter procedure can be performed after the template has been removed.

Therefore, it can be seen that the method and apparatus of the present invention provides a novel means for holding a plurality of electrical components so that the lead ends of the components will register with selected conductive pads carried on a printed circuit board, and further provides means for relieving the components from excessive heating, which would normally cause damage to the components. Further, the apparatus includes preformed lead ends on the components for assuring that the lead ends are in proper registry with the adhesive or bonding agent employed to effect securement, both mechanically and electrically.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

As previously noted, the present invention provides a novel method and apparatus for assembling a plurality of electrical components on a circuit composed of conductive strips and pads carried by a supporting plate, substrate, or printed circuit board.

Figures 1, 2, 5, 6:
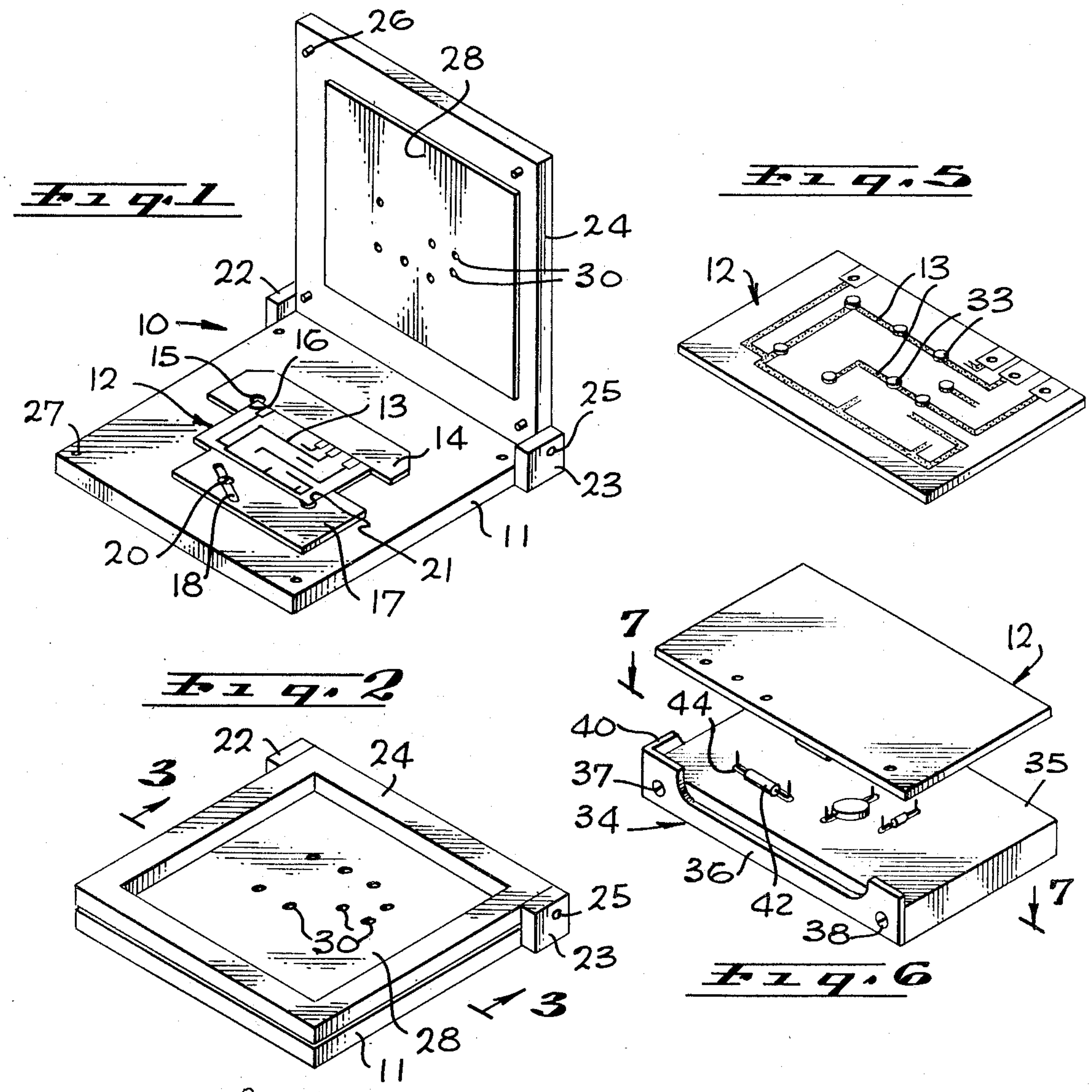
FIG. 1 is a perspective view of a fixture for retaining a printed circuit board in accordance with the practice of the present inventive method.
FIG. 2 is a perspective view of the fixture shown in FIG. 1 with an apertured plate disposed over the retained circuit board.
FIG. 5 is a perspective view of the circuit board of FIG. 4 illustrating the adhesive or bonding agent mounds as being strategically disposed on conductive strips or pads carried on the circuit board.
FIG. 6 is a perspective view of the template for holding a plurality of electrical components and showing the circuit board of FIG. 5 as being inverted preparatory to assembly with the template.

Referring to FIG. 1, a jig or fixture is indicated in the direction of arrow 10, having a base 11 on which is supported a typical printed circuit board or substrate 12. The substrate or circuit board 12 is adapted for carrying a plurality of conductors 13 to which it is desired to attach components. It is understood that in actual practice a typical supporting plate or substrate 12 would in all probability carry many more conductors than are illustrated. Also, various ones of the conductors 13 might be interconnected by means of resistors and/or capacitors which form an integral network to which prefabricated components, such as transistors and the like, are to be connected. However, inasmuch as the supporting plate or substrate and the conductive circuit carried thereby form no part of the present invention, the circuit details have not been illustrated.

The upper surface of the base 11 includes means for holding the substrate 12 which include a stationary member 14 fixedly secured thereon by means of a screw 15 and having a notched portion 16 adapted to receive a corner of the substrate against which the substrate is seated. To maintain the substrate on the base 11, the holding means further include a movable member 17 having an elongated slot 18 through which a headed screw 20 projects so that the member 17 may move against the peripheral edge of the substrate opposite to its edge engaged with the member 14. The member 17 is configured with a notch portion 21 so as to detachably engage with the corner of the substrate 12. By this construction, the movable member 17 is slid to a position where one end of the slot is engaged with the fastener 20 so that ample space is provided between the members 14 and 17 into which the substrate is received. The substrate is cornered in the notched portion 16 against the member 14, after which the member 17 is moved so that the notch portion 21 engages the opposite side of the substrate. If desired, the fastener 20 may be tightened to securely hold the substrate in this location.

One end of the base 11 is provided with mounts 22 and 23 located on opposite sides thereof having portions thereof extending above the surface of the base 11 for rotatably supporting a frame 24 via pins, such as pin 25, carried by mount 23. The frame 24 is provided with indexing means comprising a set of locating pins, such as pin 26, which are adapted to mate with corresponding holes, such as hole 27, formed in the corners of the upper surface of the base 11. Suitably secured to the under side of the frame 24 and covering the central opening thereof, there is provided an aperture plate 28 having a plurality of apertures, such as aperture 30, arranged in a predetermined pattern thereon. The particular pattern of apertures selected corresponds to desired locations on the substrate 12 intended to receive the lead ends of various components to be attached to the substrate. More specifically, the apertures are in registry with selected areas of conductive strips or pads on the substrate surface when the frame 24 has been located over the top of the base 11.

Figure 3:
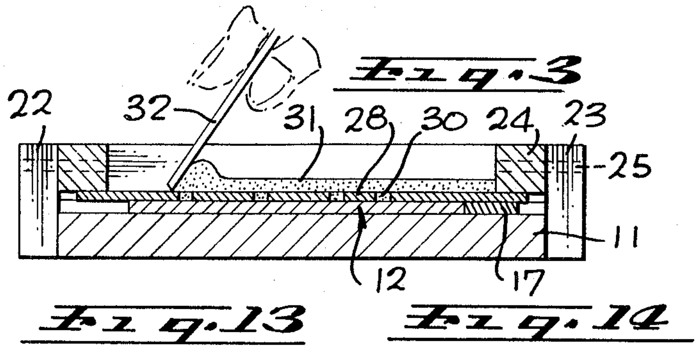
FIG. 3 is a cross-sectional view of the fixture and circuit board as taken in the direction of arrows 3—3 of FIG. 2 and illustrating a quantity of adhesive or bonding agent being applied over the apertured plate of the fixture.

Referring now to FIG. 2, the frame 24 is shown as having been positioned over the top of base 11 so that the pattern of apertures 30 is in registry with selected and predetermined conductive strip or pad areas. It is to be noted that the frame 24 includes a central opening which is covered by the plate 28 so that the surface of plate 28 serves as a bottom for a recess defined by the inner side wall surfaces of the frame 24. Therefore, the selective areas of conductive strips or pads are exposed exteriorly of the fixture via the pattern of apertures 30. As shown in FIG. 3, the recess defined by the side walls of the frame 24 is partially filled with a suitable adhesive or bonding agent, such as any commercially available solder paste, represented by the numeral 31. The paste 31 is forced into the apertures 30 and into contact with the selective areas of the conductive strips or pads. The paste is relatively tacky and tends to cling or stick to the selected areas determined by the pattern of apertures. Next, excessive paste is removed from the upper surface of the plate 28 by any conventional means, such as by employing a scraper 32, which is manually wiped across the plate to gather and remove solder paste disposed on the top thereof. After this procedure, solder paste remains within the apertures 30 in contact with the conductive strips and pads.

Figure 4:
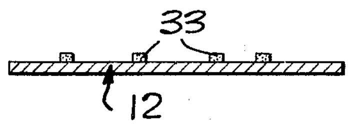
FIG. 4 is a cross-sectional view of the printed circuit board after removal from the fixture and illustrating a plurality of adhesive or bonding agent mounds disposed thereon.

Referring now to FIGS. 4 and 5, the substrate 12 is illustrated as having been removed from the fixture 10 so that a plurality of adhesive or bonding agent mounds, such as represented by numeral 33, are left deposited on the surface of the substrate in an arrangement corresponding to the pattern of apertures 30 formed in the plate 28. Each mound of solder paste represents a junction or attachment location for one of the lead ends of an electrical component.

Figure 7:
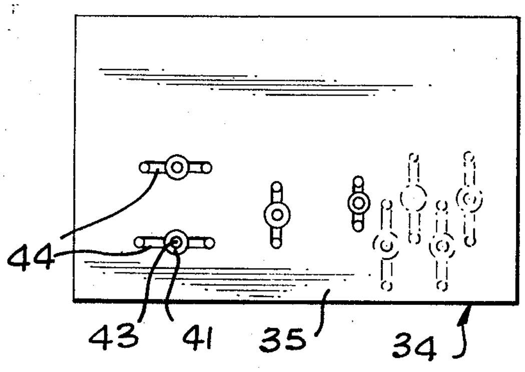
FIG. 7 is a top plan view of the template illustrated in FIG. 6 as taken in the direction of arrows 7—7 thereof.

FIGS. 6 and 7 illustrate a template which is employed for assembling components on the conductive strips or pads forming the circuit shown in FIG. 1 on the substrate 12. The template, indicated generally by the numeral 34, comprises a plate 35 which may be conveniently made of aluminum or other readily machinable, heat-conducting material. A guide 36 is secured along one side of the plate 35 by means of screws 37 and 38 and includes a corner portion 40 disposed about one corner of the plate 35. The guide 36 provides means for registering the substrate 12 with the plate 35, with the conductors 13 on the substrate turned face downward toward the plate 35.

The plate 35 is provided with a plurality of depressions 41 formed in its upper surface, each depression 41 being accurately formed and located to hold a component, such as component 42, whose leads are intended to be connected between a set of adhesive or bonding agent mounds 33. Each component is maintained within its respective depression by means of gravitational force; however, the template is provided with other means for maintaining the components and their leads accurately positioned. For example, there is an aperture 43 through the plate 35 at the position of each of the depressions 41. Each of the apertures 43 may be connected to a vacuum source, if desired, to cause the components to be securely held in the depressions 41. Such a procedure is described in more detail in my copending application referred to above.

In addition, the plate 35 is formed with a plurality of channels 44 radiating from each of the depressions in position to receive a portion of the length of each lead carried by the components seated in their respective depressions 41. The channels 44 may be milled or otherwise conventionally formed in the surface of plate 35 and are of suitable size and length to receive the component leads. The location of the depressions 41 and the channels 44 may be accurately determined by any one of several means set forth in my above-referenced copending patent application. However, the shapes and depths of the depressions and channels will vary according to various types and sizes of components to be seated therein. It is to be noted that the location of the terminating ends of the channels radiating from each depression are strategically located so as to correspond with the general pattern or location of apertures 30 formed in the plate 28. This corresponding relationship assures that when the mounds 33 are placed in the strategic or critical locations on the substrate, these locations will be in general registry with the terminating ends of the channels carried on the plate 35 so that, when the substrate is inverted as shown in FIG. 6 and placed on top of the component-laden template, the lead ends of the components will be indexed with the mounds 33 carried on the substrate.

Figure 8:
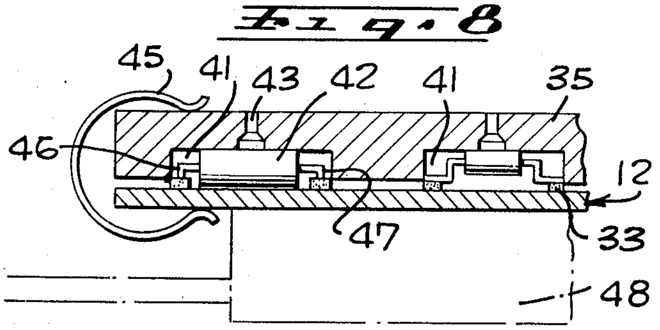
FIG. 8 is an enlarged cross-sectional view of the assembled electrical component-laden template and the printed circuit board releasably fastened together by clip means.

Referring now to FIG. 8, the substrate 12 and the component-laden plate 35 are illustrated as being held together as a unit by means of a clip 45. Component 42 is held within its depression 41 so that its lead ends 46 and 47 terminate in registry with respective mounds 33 carried on the substrate 12. To attain attachment of the lead ends with the mounds, a heat block 48 is employed on which the assembled substrate and template are placed so that the substrate 12 rests on the heat block. Heat from the block transfers to the plurality of mounds 33 to cause the paste to become molen, in which instance the lead ends become immersed in the molten paste. The assembled substrate and template need be placed on the heat block only momentarily, after which the heat block is removed and clip 45 detached to disassemble the substrate from plate 35.

Figure 9:
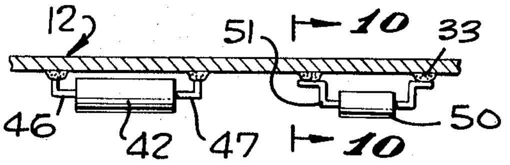
FIG. 9 is a sectional view of the printed circuit board having a plurality of electrical components secured thereon after the removal of the template.
Figure 11:
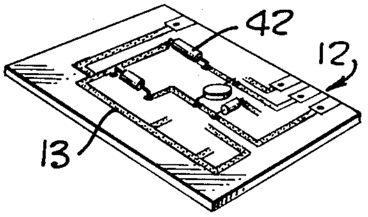
FIG. 11 is a perspective view of a completely assembled printed circuit board having a plurality of electrical components mounted thereon by employing the procedures of the present invention.

FIG. 9 illustrates a component-laden substrate wherein the components, such as component 42, are securely fastened or attached to the substrate, wherein the terminating ends of leads 46 and 47 are secured to the desired conductive strips or pads in the circuit carried by the substrate. A completed substrate is shown in FIG. 11, wherein the lead ends of the respective components are attached to selected conductive strips 13.

Figure 10:
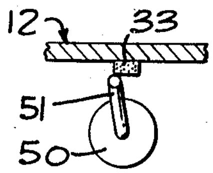
FIG. 10 is an enlarged fragmentary view, in section, of an electrical component illustrated as being misaligned with the adhesive or bonding agent mounds as taken in the direction of arrows 10—10 of FIG. 9.

In some instances, the paste may not become sufficiently molten so that the lead ends will not immerse properly within the molten paste. In other instances, the body of the component may not be seated properly within its respective depression so that the lead ends may not be perfectly aligned with the mound. FIG. 10 illustrates such a misaligned or improperly attached component lead end wherein the component is represented by numeral 50 and lead end 51 is shown as being off-center and insufficiently contacted with the solder mound 33 to effect proper attachment. In this event, the component-laden substrate 12 may be placed again on the heat block 48 for a relatively short period of time so that the mound 33 will again become molten. At this time, the mound is characterized by a surface tension, which has the tendency to draw the lead end 51 into the center of the mound. When each mound of solder paste becomes molten, adhesion occurs between portions of the molten paste contacting the substrate so that the surface of the substrate attracts the liquid molecules toward its surface while cohesion exists within the liquid molten paste that tends to oppose this attraction by pulling the liquid molecules more closely together. The surface tension effect results in the drawing or pulling in of the terminating end of the lead into a center position. This pulling action causes the component body to reorient itself either within a depression 41 or in open air, as the case may be. The drawing of the lead end into the mound causes the body of the components to right themselves so that the lead ends are in substantially perfect alignment with the mounds so that, when the heat block is removed, a proper securement is produced. It has been found that to optimize this reorienting effect the effective base area of the solder mound should not be more than ten times the effective cross-sectional area of the terminating lead but in all cases greater than such cross-sectional area.

Figure 13:
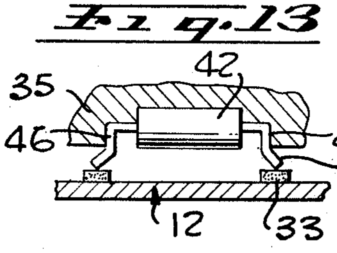
FIG. 13 is an enlarged sectional view of a component seated in a template recess with the lead ends in registry with the adhesive mounds preparatory to securement therewith.
Figure 12:
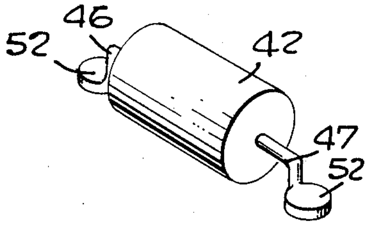
FIG. 12 is an enlarged perspective view of an electrical component having its lead ends angled and flattened.

FIG. 12 illustrates an electronic component, such as component 42, wherein the terminating ends of the leads 46 and 47 have been formed into flat pads 52. The terminating end of each lead is not only flattened to form the pad 52, but is angularly formed at about a 5° angle with respect to the central longitudinal axis of the component. This relationship is more clearly shown in FIGS. 13 and 14. Referring now more particularly to these latter figures, it can be seen that the body of component 42 is seated within a depression formed in the plate 35 and that the leads of the component are disposed within the channels associated with the depression so that the flat pads 52 project into contact with the mounds 33 carried on the substrate 12. Because the terminating ends forming pads 52 are angularly disposed, a force is generated which operates to maintain the major length of each lead in its respective channel and in contact with the plate 35. Therefore, the engagement of the lead with the plate 35 operates as a heat transmission path so that the plate 35 functions as a heat sink for absorbing and dissipating heat from the heat block 48 during the attachment of the lead ends to the respective conductive strips or pads carried on the substrate 12.

Figure 14:
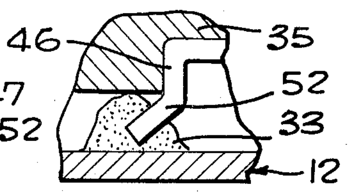
FIG. 14 is a greatly enlarged fragmentary view illustrating the terminating end of a component lead submerged in the molten adhesive or bonding agent immediately prior to cooling to effect securement.

In FIG. 14 the mound 33 has been heated to a point where the solder paste is molten, which causes the terminating end formed into pad 52 of the lead 46 to become immersed in the solder paste. The slight pressure of the lead 46 in engagement with the plate 35 is relieved as the pad 52 sings into the molten mound 33. The heat of the molten mound causes the pad 52 to straighten slightly so that it is no longer substantially angled with respect to the central longitudinal axis of the component body. Upon removing the heat block from the substrate, the component-laden substrate is cooled so that a mechanical and electrical attachment is produced between the pads 52 and the surface of the substrate via the solidified solder paste mound 33.

Figure 15:
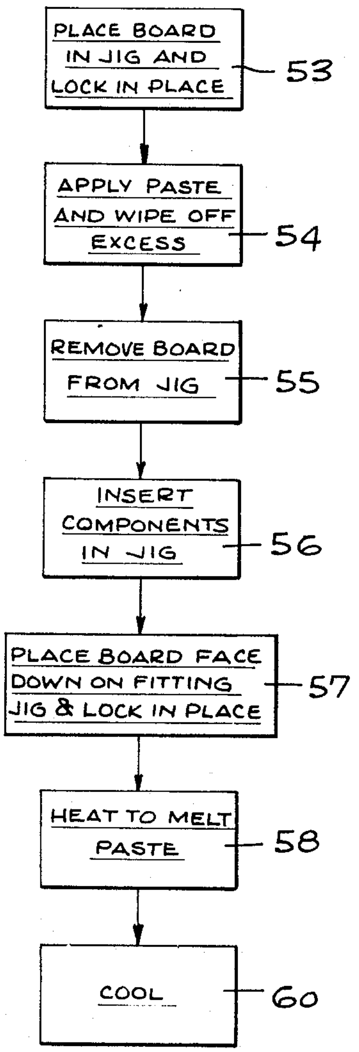
FIG. 15 is a block flow diagram illustrating the sequence of fabricating steps employed in practicing the method of the present invention.

Referring now in detail to FIG. 15, the sequence of steps for practicing the method of the present invention is diagrammatically illustrated. Initially, the substrate 12 is located (53) on the upper surface of the base 11 of the fixture 10 and locked into place between holding members 14 and 17. Next, the frame 24 is placed over the located substrate so that the apertured plate 28 covers the surface of the substrate having conductive strips and pads. A suitable solder paste or other adhesive or bonding agent is applied (54) over the exposed surface of the apertured plate so that the material of the paste will be introduced through the apertures 30 into clinging contact with selective surface areas on the face of the substrate 12. The excess paste is wiped or removed from the aperture plate, and the substrate 12 is removed (55) from the fixture. The substrate 12 now includes a plurality of mounds 33 as shown in FIG. 5.

A plurality of electrical components, such as resistors, transistors, capacitors, etc., are placed (56) within depressions 41 of the template 34 so that the outwardly extending lead ends from the body of these components reside within channels 44 associated with a respective depression. After the components have been inserted into the template, the substrate 12 is placed (57) inverted over the component-laden template so that the pattern of mounds 33 substantially corresponds with the pattern of terminating lead ends of the components. The assembled substrate and plate 35 are clipped together, and the assembly is placed on a heat block 48, with the substrate adjacent the block to apply heat (58) sufficient to melt the material forming mounds 33 so that the terminating ends of these components are completely immersed in the molten material. The heat block 48 is maintained in contact with the substrate only momentarily and is removed so that the molten mound 33 can be cooled (60). Cooling can be readily effected by placing the substrate 12 on a cold metal block.

After inspection, if the lead ends are not properly attached as described earlier, the substrate 12 may again be placed on the heat block 48 momentarily and, after removal, cooled to solidify the molten solder paste. When the solder paste is molten, a surface tension is created which will have a tendency to draw or pull the component leads centrally of the mound so that proper registration of the lead ends with the respective mounds is assured.

While particular embodiments of the present invention have been shown and described, it will be obvious to those skilled in the art that changes and modifications may be made without departing from this invention in its broader aspects, and therefore the aim in the appended claims is to cover all such changes and modifications as fall within the true spirit and scope of this invention.

The embodiments of the invention in which an exclusive property or privilege is claimed are defined as follows:

1. A method for assembling electrical components having leads extending outwardly from a body portion thereof onto a substrate having selected areas of conductors carried on one surface thereof, comprising the steps of:

depositing a thermal sensitive, electrically conductive paste in the form of a predetermined quantity of mounds in a particular pattern on the conductors so that each mound is placed on one of the selected areas thereof;

placing the components within open depressions of a template whereby the leads of the components seat within channels formed in the template and connected to the depressions wherein the respective channels are oriented so that the extended free ends of the leads form a pattern similar to the pattern of said deposited mounds;

placing the substrate adjacent said component laden template so that the free ends of the leads register with and engage with selected ones of the plurality of mounds;

heating the plurality of mounds to melt the paste so that the extended free ends of the leads become immersed in the molten paste; and cooling said molten mounds to provide a mechanical and electrical attachment between the lead ends and the substrate.

2. The method as defined in claim 1 wherein said heating step melts the mounds to produce a surface tension condition adapted to draw and pull the free ends of the leads into a central location with respect to each of said molten mounds.

3. The method as defined in claim 2 wherein said depositing step includes applying the paste over an apertured plate and removing excess paste therefrom so as to fill the apertures with a predetermined quantity of paste.

4. The method as defined in claim 3 wherein said placing step includes applying a force to the leads seated in the template channels so as to cause the leads to contact the template for heat transference purposes whereby the template effectively operates as a heat sink for relieving the components from being subjected to excessive and damaging heat produced during said heating step.

5. A method for mechanically and electrically attaching electrical components having leads extending outwardly from a body portion onto a substrate having conductors carried on a surface thereof, comprising the steps of:

depositing a plurality of heat sensitive, electrically conductive mounds in a predetermined pattern on selected areas of the conductors;

retaining the components in positions so that their leads terminate in a pattern corresponding to said predetermined pattern;

locating the retained components with respect to the substrate so that the free ends of the component leads register with and engage selected ones of the plurality of mounds;

heating the plurality of mounds to a molten state so that the free ends of the component leads become immersed therein; and cooling the molten mounds so as to provide a mechanical and electrical attachment between the free ends of the components and the substrate at the selected conductor areas.

References Cited

UNITED STATES PATENTS

| | | | |
|---|---|---|---|
| 3,226,804 | 1/1966 | Hasenclever | 29—502 X |
| 3,355,078 | 11/1967 | Smith | 228—44 |

JOHN F. CAMPBELL, Primary Examiner

R. J. CRAIG, Assistant Examiner

U.S. Cl. X.R.

29—407, 470, 577; 228—44, 56; 317—101